United States Patent
Miyauchi et al.

(10) Patent No.: US 9,461,638 B2
(45) Date of Patent: Oct. 4, 2016

(54) DRIVE UNIT FOR SWITCHING ELEMENT

(71) Applicant: DENSO CORPORATION, Kariya, Aichi-pref. (JP)

(72) Inventors: Syun Miyauchi, Chiryu (JP); Junichi Fukuta, Kuwana (JP); Tomoyuki Muraho, Nagoya (JP); Takeyasu Komatsu, Chiryu (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/785,804

(22) Filed: Mar. 5, 2013

(65) Prior Publication Data

US 2013/0229209 A1    Sep. 5, 2013

(30) Foreign Application Priority Data

Mar. 5, 2012 (JP) ................. 2012-047852

(51) Int. Cl.
| | |
|---|---|
| *H03B 1/00* | (2006.01) |
| *H03K 3/00* | (2006.01) |
| *H03K 17/56* | (2006.01) |
| *H03K 17/14* | (2006.01) |

(52) U.S. Cl.
CPC .............. *H03K 17/56* (2013.01); *H03K 17/14* (2013.01)

(58) Field of Classification Search
CPC ..................... H03K 17/04126; H03K 17/063; H03K 2217/0036; H03K 17/601; H03K 17/0826
USPC .................................................. 327/108–112
See application file for complete search history.

(56) References Cited

U.S. PATENT DOCUMENTS

| | | |
|---|---|---|
| 5,500,619 A | 3/1996 | Miyasaka |
| 2011/0221481 A1* | 9/2011 | Kifuku ........................ 327/109 |
| 2012/0075761 A1* | 3/2012 | Miura et al. ................. 361/93.1 |

FOREIGN PATENT DOCUMENTS

JP         3067448       5/2000

* cited by examiner

*Primary Examiner* — Lincoln Donovan
*Assistant Examiner* — Diana J Cheng
(74) *Attorney, Agent, or Firm* — Nixon & Vanderhye PC

(57) ABSTRACT

A drive unit includes a charging unit which charges an opening/closing control terminal of a switching element to switch a drive state. The switching element includes a sensing terminal which outputs a minute current having a correlation with current flowing between input and output terminals of the switching element. The sensing terminal and either of the output terminal or a member having a potential equal to that of the output terminal are connected via a sensing resistor. The drive unit further includes an active gate control unit which changes a charge rate based on comparison of sensing voltage, which is a potential difference across the sensing resistor, or a rate of change of the sensing voltage with a specified value. The specified value is set based on individual-difference information of the switching element which indicates a characteristic, which affects the sensing voltage, when the drive state is switched.

11 Claims, 9 Drawing Sheets

FIG.6A
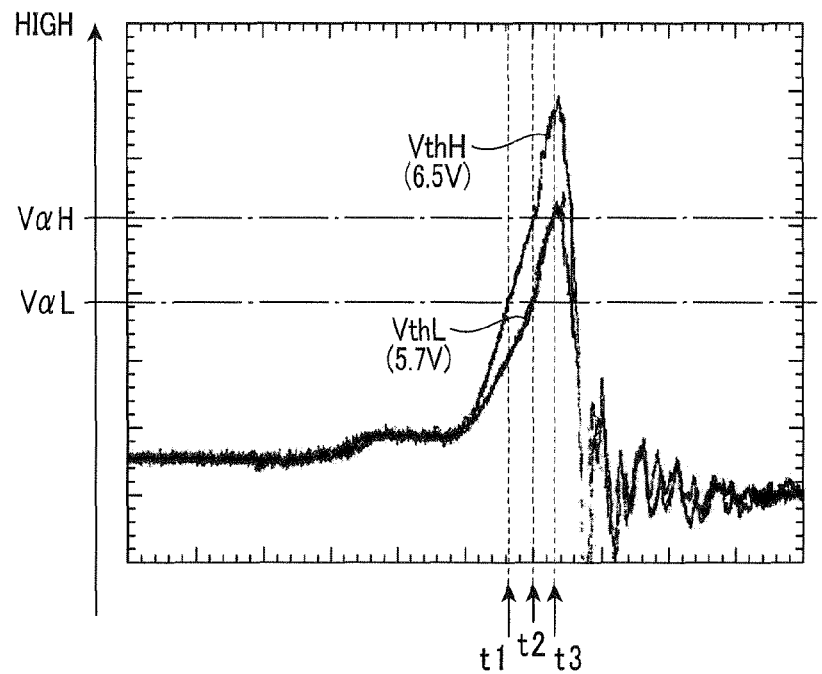
FIG.6B
FIG.7
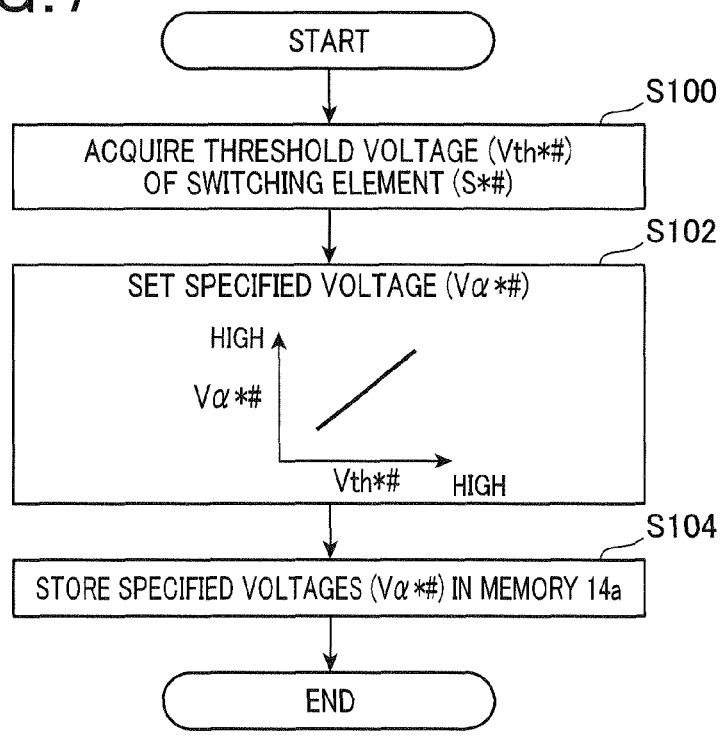

DRIVE UNIT FOR SWITCHING ELEMENT

CROSS-REFERENCE TO RELATED APPLICATION

This application is based on and claims the benefit of priority from earlier Japanese Patent Application No. 2012-047852 filed Mar. 5, 2012, the description of which is incorporated herein by reference.

BACKGROUND

1. Technical Field

The present invention relates to a drive unit for a switching element, the drive unit driving a voltage-controlled switching element.

2. Related Art

When gate charge is provided to a switching element, the speed of providing the gate charge is controlled. This is a well-known technique as disclosed in a patent document JP-B-3067448. Specifically, in this technique, the speed of providing gate charge is controlled in a semiconductor switching element (IGBT (insulated gate bipolar transistor)) when the switching element is turned off under the conditions where large current flows across the collector and the emitter of the switching element. More specifically, the switching element is provided with a sensing terminal that outputs minute current having a correlation with the collector current that flows through the switching element. The sensing terminal is connected to the emitter of the switching element via a sensing resistor. The gate of the switching element is connected to the emitter via a resistor and a MOSFET (metal oxide semiconductor field-effect transistor). The MOSFET has a gate connected to a connecting point between the sensing terminal and the sensing resistor.

In the above configuration, the MOSFET is turned on when a large current flows through the switching element and thus the potential difference (sensing voltage) across the sensing resistor becomes high. Thus, electric charge is provided into the gate of the switching element to turn off the switching element. In this case, the resistor provided between the gate and the emitter of the switching element can reduce the speed of providing gate charge (hereinafter "the speed of providing gate charge" is referred to as a "charge rate"). Accordingly, the switching element is prevented from being alternately turned on and off due to the turn-off operation of the switching element. In this way, the reliability of the switching element is ensured.

The technique of controlling charge rate includes so-called active gate control. Under the active gate control, when the drive state of a switching element is switched from an on-state to an off-state, or vice versa, the charge rate is changed to achieve the switching. This technique has a purpose of reducing surge voltage or switching loss caused in switching the drive state of a switching element.

The inventors of the present invention paid attention to the phenomenon that the sensing voltage drastically increases when the drive state of a switching element is switched from an on-state to an off-state, or vice versa, and arrived at a conclusion of using the process of changing the charge rate, which is based on the comparison of the sensing voltage or the rate of change of the sensing voltage with a specified value. However, use of this process involves problems as set forth below.

Mass-produced switching elements have individual differences. The individual differences may lead to differences in the behavior of the sensing voltage between the switching elements when the drive state of the switching elements is switched. If a common specified value is used for the individual mass-produced switching elements for the comparison mentioned above, the difference in the behavior of the sensing voltage between the switching elements may create inconveniences. For example, due to the use of a common specified value, the timing of changing the charge rate may be deviated from an appropriate timing of reducing surge voltage or switching loss. If inconveniences such as the above are created, surge voltage or switching loss may problematically increase.

SUMMARY

An embodiment provides a drive unit for a switching element which is capable of performing active gate control and can favorably suppress the increase of surge voltage or switching loss due to the individual difference of the switching element.

As an aspect of the embodiment, a drive unit for a switching element is provided which includes a charging unit which charges an opening/closing control terminal of a voltage-control type switching element to switch a drive state of the switching element from an on-state to an off-state, or vice versa. The switching element includes a sensing terminal which outputs a minute current having a correlation with current flowing between an input terminal and an output terminal of the switching element. The sensing terminal and either of the output terminal of the switching element or a member having a potential equal to that of the output terminal are connected via a sensing resistor. The drive unit further includes an active gate control unit which changes a charge rate based on comparison of sensing voltage, which is a potential difference across the sensing resistor, or a rate of change of the sensing voltage with a specified value. The specified value is set based on individual-difference information of the switching element which indicates a characteristic, which affects the sensing voltage, when the drive state of the switching element is switched from an on state to an off state, or vice versa.

BRIEF DESCRIPTION OF THE DRAWINGS

In the accompanying drawings:

FIGS. 6A and 6B are diagrams illustrating deviation in discharge rate changing timing, the deviation being due to difference in a threshold voltage;

FIG. 7 is a flow diagram illustrating a step of setting a specified voltage in the course of manufacture, according to the first embodiment;

DETAILED DESCRIPTION OF THE
PREFERRED EMBODIMENTS (First Embodiment)

With reference to the accompanying drawings, hereinafter are described some embodiments of the present invention.

First, referring to FIGS. 1 to 7, a first embodiment of the present invention is described. In the first embodiment, a drive unit for a switching element is applied to a vehicle that includes an electric rotating machine as an in-vehicle traction unit.

Figure 1:
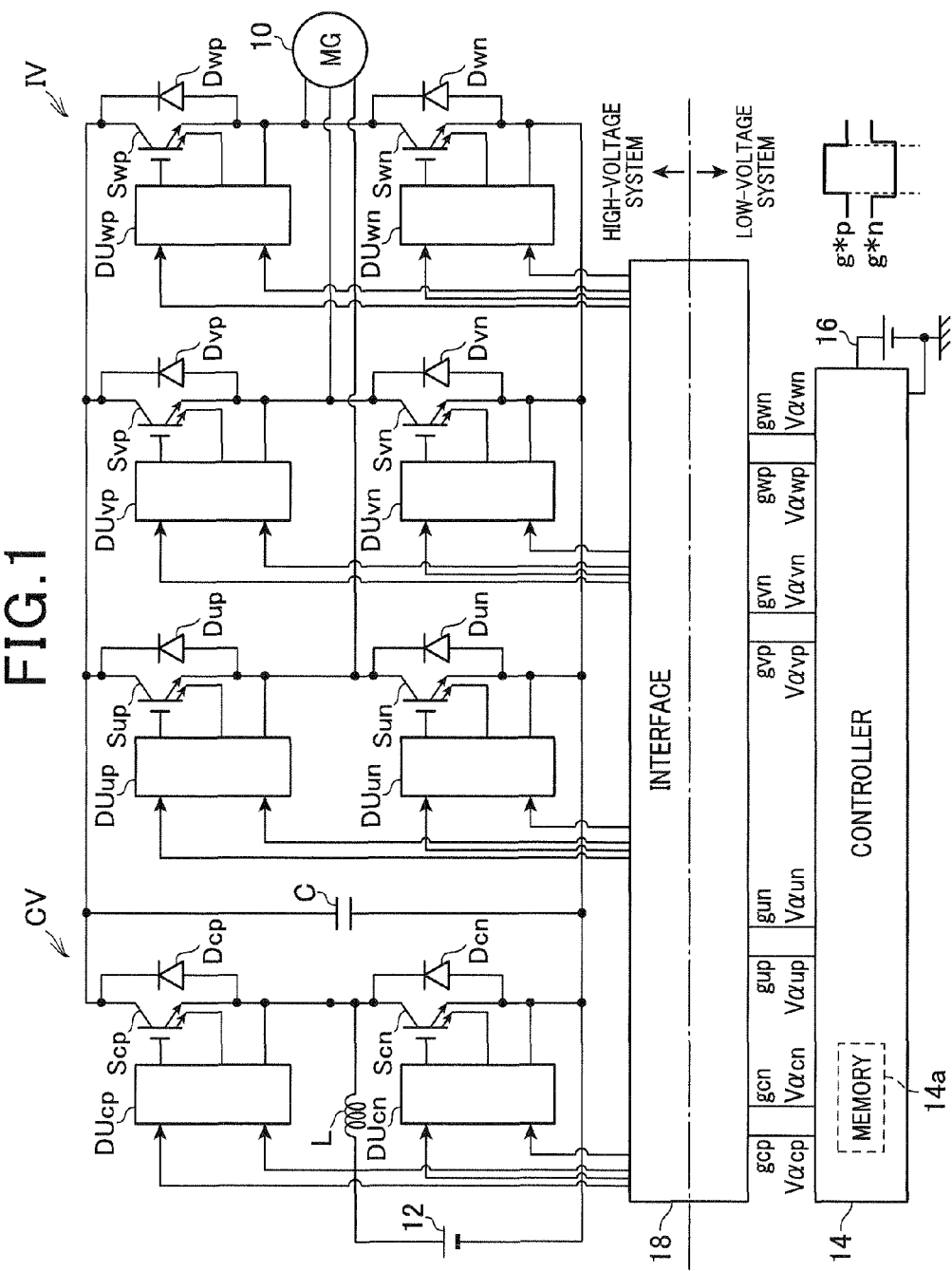
FIG. 1 is a schematic diagram illustrating a system configuration according to a first embodiment.

FIG. 1 is a schematic diagram generally illustrating a system according to the first embodiment.

As shown in FIG. 1, the system includes a motor-generator 10 that is a three-phase rotating machine as an in-vehicle traction unit, which is mechanically connected to drive wheels, not shown. The motor-generator 10 is connected to a high-voltage battery 12 via an inverter IV and a converter CV. The converter CV includes a capacitor C, a pair of switching elements Scp and Scn, and a reactor L. The switching elements Scp and Scn, which are serially connected to each other via a connecting point therebetween, are connected in parallel with the capacitor C. The reactor L connects the connecting point of the switching elements Scp and Scn to the positive electrode of the high-voltage battery 12. Specifically, the converter CV has a function of stepping up the voltage of the high-voltage battery 12 (e.g., 288 V), with a predetermined voltage (e.g., 666 V) as an upper limit, by turning on/off the switching elements Scp and Scn.

On the other hand, the inverter IV includes a serial connection of switching elements Sup and Sun, a serial connection of switching elements Svp and Svn and a serial connection of switching elements Swp and Swn. These serial connections have respective connecting points which are connected to phases U, V and W, respectively, of the motor-generator 10.

In the present embodiment, an insulated gate bipolar transistor (IGBT) is used as a switching element S*# (*=c, u, v, w; and #=p, n). Each of the switching elements S*# is in reverse-parallel connection with a freewheel diode D*#. Further, the switching elements S*#, the freewheel diodes D*# and the like are each packaged to configure respective power cards. The converter CV and the inverter IV are provided with such power cards.

The system also includes a control unit 14 that uses a low-voltage battery 16 as a power supply. The control unit 14 operates the inverter IV and the converter CV in order to perform normal control under which the controlled variable (e.g., torque) of the motor-generator 10 is desirably controlled. Specifically, the control unit 14 outputs operation signals gcp and gcn to drive units DUcp and DUcn, respectively, to control the switching elements Scp and Scn of the converter CV. The control unit 14 also outputs operation signals gup, gun, gvp, gvn, gwp and gwn, which are generated under well-known sine-wave PWM (pulse width modulation) control, for example, to drive units DUup, DUun, DUvp, DUvn, DUwp and DUwn to control the switching elements Sup, Sun, Svp, Svn, Swp and Swn, respectively, of the inverter IV. The operation signal g*p at a high-potential side stands in complementary relation to the corresponding operation signal g*n at a low-potential side. In other words, the high-potential-side switching element S*p and the corresponding low-potential-side switching element S*n are alternately turned on.

The drive units DU*# are mounted on a circuit board which is formed by arranging a wiring pattern made of conductive material, such as copper, on an insulating base member made such as of a resin. For example, the normal control of the motor-generator 10 refers to a control under which the output torque of the motor-generator 10 can be controlled according to the user's operation of an operating member (e.g., accelerator pedal) that is an object to be operated to give an instruction on the output torque of the motor-generator 10.

The system also includes an interface 18 that insulates between a high-voltage system including the high-voltage battery 12 and a low-voltage system including the low-voltage battery 16. Through the interface 18, signal transmission/reception is performed between these high- and low-voltage systems. In the present embodiment, an opto-insulated element (photocoupler) is used as the interface 18.

The control unit 14 includes a memory 14a (non-volatile memory) as a storing means (unit). It should be appreciated that the converter CV, the inverter IV and the control unit 14 configure a power control unit.

Figure 2:
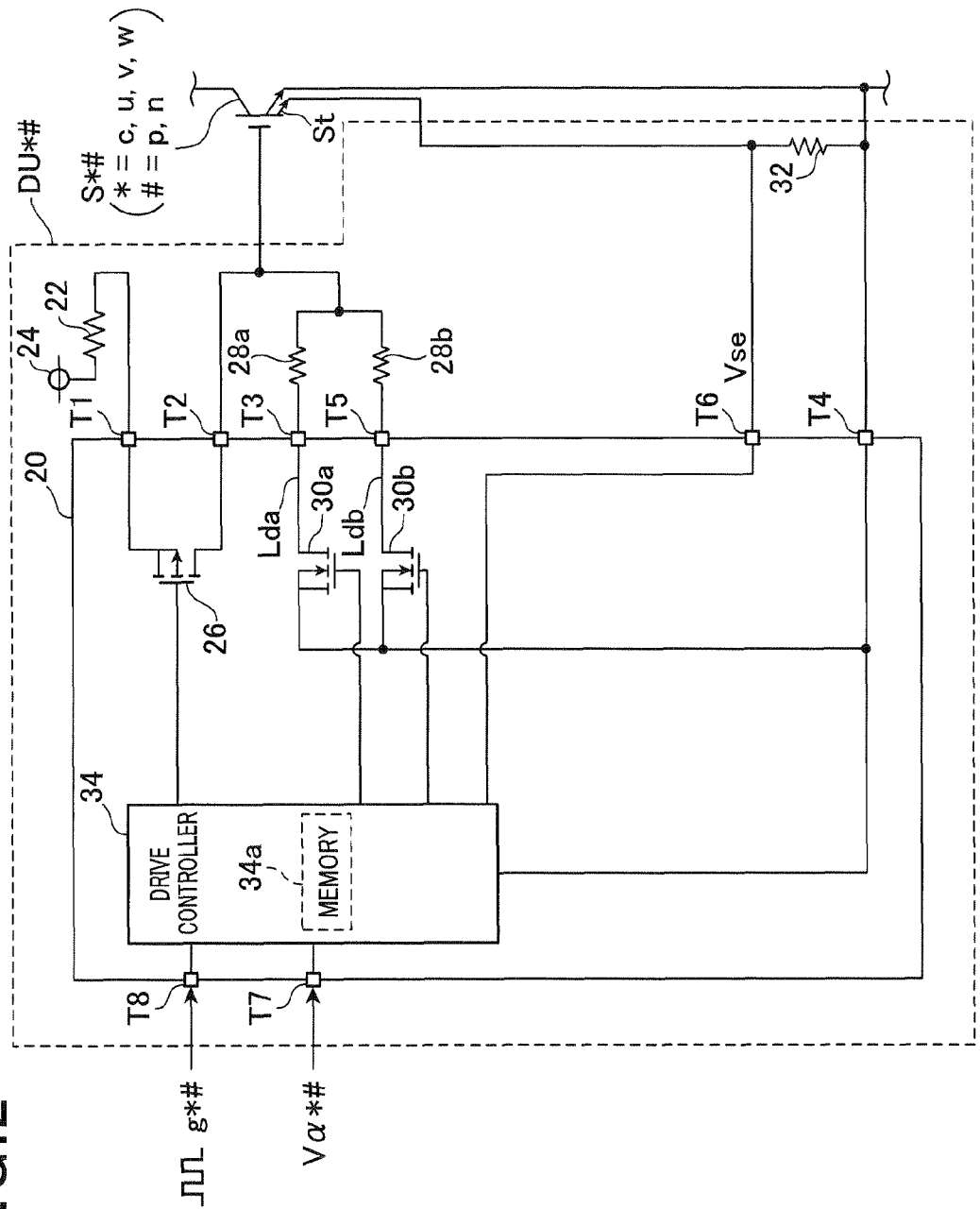
FIG. 2 is a schematic diagram illustrating a drive unit according to the first embodiment.

Referring now to FIG. 2, hereinafter is described how the drive unit DU*# of the present embodiment is configured.

FIG. 2 is a schematic diagram illustrating the drive unit DU*# according to the present embodiment. As shown in FIG. 2, the drive unit DU*# includes a drive IC (integrated circuit) 20 that is a semiconductor integrated circuit in the form of a chip. The drive IC 20 has a terminal T1 to which a constant-voltage power supply 24 is connected to apply voltage to an opening/closing control terminal (gate) of the switching element S*# via a charging resistor 22.

The terminal T1 is connected to a terminal T2 of the drive IC 20 via a P-channel MOSFET (charging switching element 26). The terminal T2 is connected to the gate of the switching element S*#.

The gate of the switching element S*# is connected to a terminal T3 of the drive IC 20 via a first discharging resistor 28a. The terminal T3 is connected to a terminal T4 of the drive circuit IC 20 via an N-channel MOSFET (first discharging switching element 30a). Further, the gate of the switching element S*# is connected to a terminal T5 of the drive IC 20 via a second discharging resistor 28b. The terminal T5 is connected to the terminal T4 via an N-channel MOSFET (second discharging switching element 30b). The terminal T4 is connected to the emitter of the switching element S*#.

The first and second discharging resistors 28a and 28b may have the same or different resistance.

The switching element S*# has a sensing terminal St that outputs minute current having a correlation with collector current. Specifically, for example, the sensing terminal St outputs a current of about one several-thousandth to one ten-thousandth of the collector current. The sensing terminal St is connected to the emitter of the switching element S*# via a sensing resistor 32. Thus, voltage drop is caused in the sensing resistor 32 by the minute current outputted from the sensing terminal St. Accordingly, the potential of the sensing resistor 32 at a sensing terminal St side (hereinafter referred to as sensing voltage Vse) will have an electrical state quantity that has a correlation with the collector current. The sensing voltage Vse is inputted to a drive controller 34, which is provided inside the drive IC 20, via a terminal T6 of the drive IC 20.

In the present embodiment, the sensing voltage Vse is defined to be positive when the end of the sensing resistor 32 at the sensing terminal Ts side has a potential higher than the potential of the emitter. The emitter is rendered to have a potential of 0 V.

The drive controller 34 has a memory 34a as a storing means. The memory 34a stores a specified voltage $V\alpha$*# which is outputted from the low-voltage system (control unit 14) via the interface 18 and the terminal T7 of the drive IC 20. In the present embodiment, the memory 34a may be a volatile memory or a non-volatile memory.

Hereinafter is described a process of charging/discharging gate charge (hereinafter referred to as a charge/discharge process) of the present embodiment performed by the drive controller 34. Since the drive controller 34 of the present embodiment is a hardware component, the charge/discharge process is actually performed by a logic circuit.

First, a process of charging the gate (charge process) is described.

In the present embodiment, when the operation signal g*# inputted via a terminal T8 of the drive IC 20 is a turn-on command, the charging switching element 26 is turned on. Thus, gate charge (positive electric charge) is charged by the constant-voltage power supply 24 to switch the switching element S*# from an off state to an on state. In the period when the charge process is performed, the first and second discharging switching elements 30a and 30b are turned off.

Secondly, a process of discharging the gate (discharge process) is described.

In the present embodiment, active gate control is performed sometime in a period from when release of the gate charge (providing negative electric charge) is started until when it is completed. Under the active gate control, the resistance of a discharging path (charging path of negative electric charge) connected to the gate of the switching element S*# is changed from low to high. The active gate control is performed for the purpose of reducing surge voltage or switching loss when the switching element S*# is switched from an on state to an off state.

Specifically, when the operation signal g*# is a turn-off command, both of the first and second discharging switching elements 30a and 30b are turned on to change the speed of releasing gate charge (hereinafter the "speed of releasing gate charge" is referred to as a "discharge rate") (charge rate of negative electric charge) from low to high. Thus, the gate charge is released via both of a first discharging path Lda and a second discharging path Ldb. The first discharging path Lda connects the gate of the switching element S*# to the emitter thereof via the first discharging resistor 28a and the first discharging switching element 30a. The second discharging path Ldb connects the gate to the emitter via the second discharging resistor 28b and the second discharging switching element 30b. After that, of the first and second discharging switching elements 30a and 30b, the second discharging switching element 30b is switched to an off state to change the discharge rate from high to low. Thus, the gate charge is released via the first discharging path Lda and the switching element S*# is switched from an on state to an off state. While the discharge process is performed, the charging switching element 26 is turned off. The first and second discharging paths Lda and Ldb correspond to the plurality of discharging paths connected to the gate (charging paths of negative electric charge).

Figure 3:
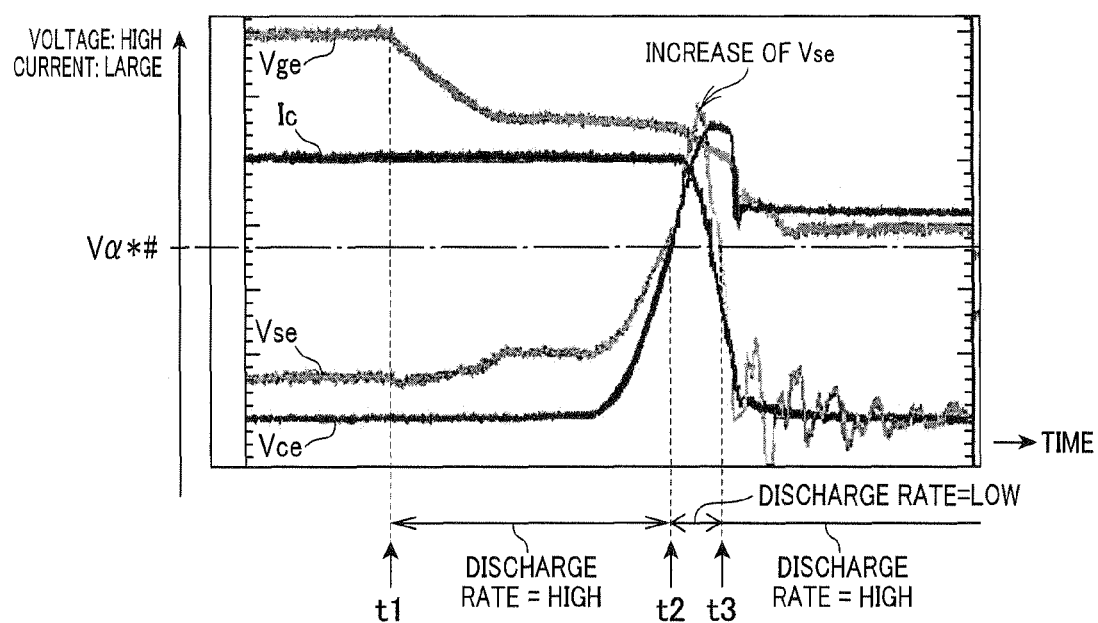
FIG. 3 is a schematic diagram illustrating a discharge process according to the first embodiment.

In the present embodiment, as shown in FIG. 3, the timing when the discharge rate is changed from high to low is obtained based on the comparison between the sensing voltage Vse and the specified voltage $V\alpha$*#. FIG. 3 shows measurements of transitions of gate voltage Vge, collector current Ic, sensing voltage Vse and inter-collector-emitter voltage Vce. The inter-collector-emitter voltage here refers to the voltage between the collector and the emitter of the switching element S*#.

As shown in FIG. 3, the operation signal g*# is switched to a turn-off command, at time t1, to start release of the gate charge. Then, the timing (time t2) for the sensing voltage Vse to pass from below to above the specified voltage $V\alpha$*# (>0) is obtained as the timing of changing the discharge rate (hereinafter referred to as discharge rate changing timing). The reason why the sensing voltage Vse is used for obtaining the changing timing is that the phenomenon of the sending voltage Vse can be made use of. The phenomenon is that the sensing voltage Vse drastically increases in the vicinity of time t2 to time t3 in the period in which the switching element S*# is switched from an on state to an off state. More specifically, the reason for using the sensing voltage Vse is that, under the conditions where such a phenomenon is exhibited, the discharge rate changing timing at which surge voltage or switching loss can be reduced in switching the switching element S*# from an on state to an off state, can be correlated to the timing at which the sensing voltage Vse passes from below to above the specified voltage $V\alpha$*#. There is a tendency that as the period becomes shorter from when the operation signal is switched to a turn-off command until when the discharge rate changing timing occurs, the effect of reducing surge voltage becomes larger but the effect of reducing switching loss becomes smaller.

After that, at time t3 when the sensing voltage Vse passes from above to below the specified voltage $V\alpha$*#, the discharge rate of the gate charge is again changed from low to high. Then, when the gate voltage becomes "0", release of the gate charge is completed. It is considered that the phenomenon in which the sensing voltage Vse drastically increases is caused when the inter-collector-emitter voltage or the surge voltage caused in switching the switching element S*# to an off state is superimposed on the sensing voltage Vse via parasitic capacitance or the like between the collector or the emitter and the gate of the switching element S*#.

The specified voltage $V\alpha$*# is stored in the memory 14a of the control unit 14. Details of this will be described later. In the present embodiment, active gate control is used only in the discharge process. This is based on the research conducted by the inventors of the present invention. According to the research, a switching loss Eoff when the switching element S*# is switched to an off state is larger than a switching loss Eon when the switching element S*# is switched to an on state (e.g., Eoff:Eon=8:2).

Hereinafter is described a process of setting the specified voltage $V\alpha$*#, according to the present embodiment.

Figure 4:
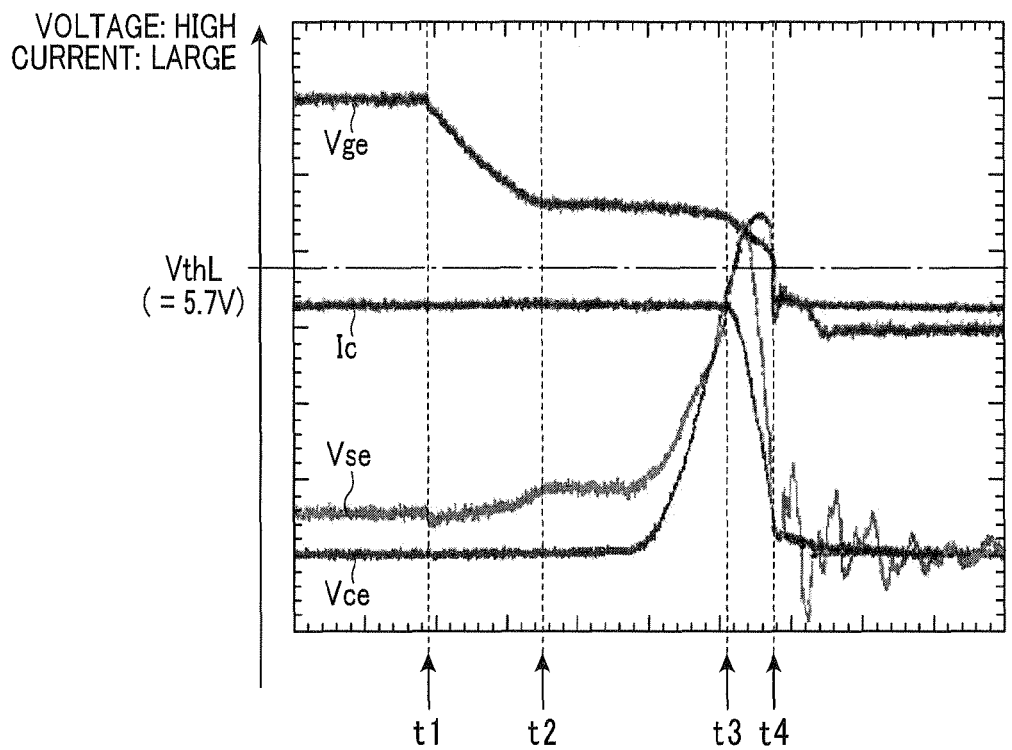
FIG. 4 is a diagram illustrating the behavior of sensing voltage in the discharge process.
Figure 5:
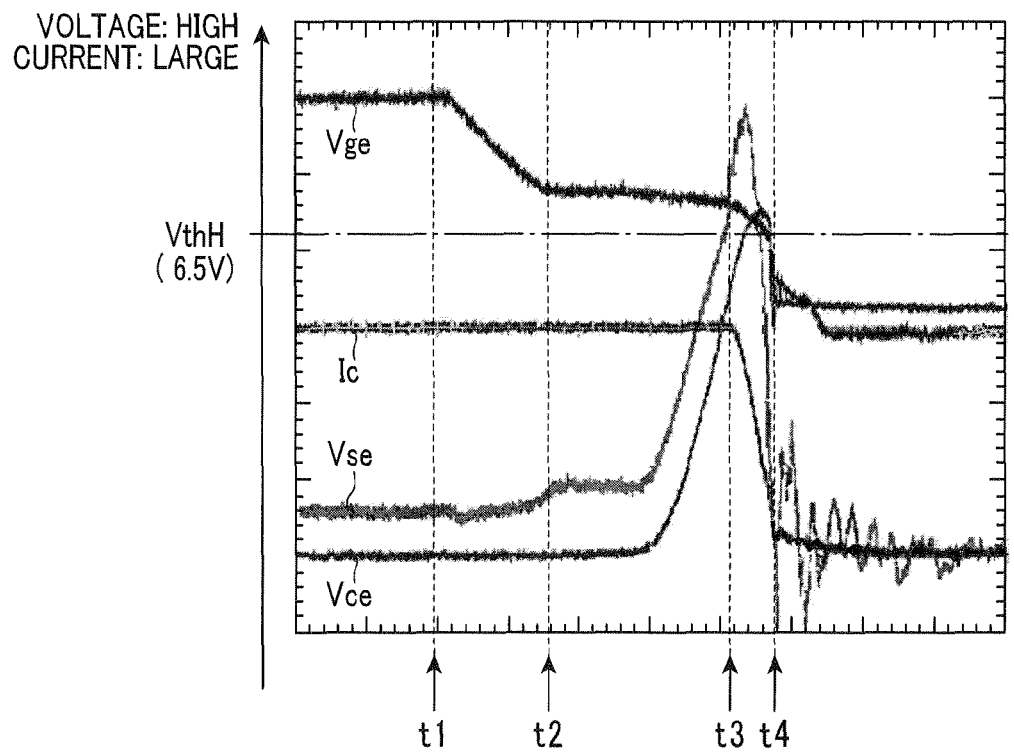
FIG. 5 is a diagram illustrating the behavior of sensing voltage in the discharge process.

In the present embodiment, the specified voltage Vα# is set for each of the switching elements S*# provided in the converter CV and the inverter IV, based on the information on the individual difference (hereinafter referred to as individual-difference information) of the switching element S*#. The individual-difference information here refers to the information that indicates characteristics of the switching element S*#, which make impact on the sensing voltage when the switching element is switched from an on state to an off state. In particular, in the present embodiment, the gate voltage Vge is used as the individual-difference information. The gate voltage Vge is generated at the timing when the flow of the collector current Ic is cut off by switching the operation signal to a turn-off command to continue release of the gate charge (this gate voltage Vge is hereinafter referred to as a threshold voltage Vth*#). As the threshold voltage Vth*# has a larger value, the specified voltage Vα*# is set to a larger value. This way of setting the specified voltage Vα*# can prevent deviation of the discharge rate changing timing from the timing appropriate for reducing surge voltage or switching loss, the deviation being attributed to the individual difference in the threshold voltage of each mass-produced switching element. Referring to FIGS. 4 to 6, hereinafter is described an impact of the threshold voltage Vth*# on the discharge rate changing timing.

Similar to FIG. 3, FIGS. 4 and 5 each show measurements of transitions of gate voltage Vge and others. The measurements shown in FIGS. 4 and 5 are obtained on condition that the collector current Ic (e.g., 300 mA) and the temperature of the switching element S*# (e.g., 25° C.) when the switching element S*# is in an on state are the same throughout the measurements.

FIG. 4 shows measurements in the case of using a switching element having a threshold voltage that is a lower limit among the threshold voltages of mass-produced switching elements (hereinafter referred to as a lower limit voltage VthL). In the present embodiment, the lower limit voltage VthL is 5.7 V. FIG. 5 shows measurements in the case of using a switching element having a threshold voltage that is an upper limit among the threshold voltages of mass-produced switching elements (hereinafter referred to as an upper limit VthH). In the present embodiment, the upper limit voltage VthH is 6.5 V.

As shown in FIGS. 4 and 5, at time t1, the operation signal g*# is switched to a turn-off command to start release of the gate charge. After that, at time t2, the gate voltage Vge turns to mirror voltage to start a mirror period.

After that, at time t3, the mirror period is ended and the gate voltage Vge is again lowered. At the same time, the collector current Ic begins to lower. Then, at time t4, the gate voltage Vge turns to the threshold voltage (lower limit voltage VthL or upper limit voltage VthH) to cut off the collector current Ic. In a short period following time t4, the collector current Ic gradually decreases toward 0. This gradual decrease is attributed to the flow of tail current.

The inventors of the present invention conducted experiments and revealed that the sensing voltage Vse, when the switching element is switched from an on state to an off state, is high in the switching element having the upper limit voltage VthH as the threshold voltage, compared with the switching element having the lower limit voltage VthL as the threshold voltage. Specifically, after the switching element is switched to an off state, the inter-collector-emitter voltage Vce increases. Together with the increase of the inter-collector-emitter voltage Vce, the sensing voltage Vse increases toward its peak. Thus, the sensing voltage Vse becomes high. As a result, the sensing voltage Vse will have a large peak value.

In spite of the fact that the behavior of the sensing voltage Vse depends on the threshold voltage, when a common specified voltage is set in the individual switching elements S*# provided in the converter CV and the inverter IV, the disadvantages as set forth below will be created.

FIGS. 6A and 6B show measurements of transition of the sensing voltage Vse when the switching element S*# is switched from an on state to an off state.

In the example shown in FIGS. 6A and 6B, in using a switching element having the lower limit voltage VthL as a threshold voltage, the specified voltage VαL is adjusted based on experiments. The adjusted voltage VαL is made suitable for the discharge rate changing timing (time t2) that exerts a proper effect of reducing switching loss or surge voltage.

When the adjusted specified voltage VαL is applied to a switching element having the upper limit voltage VthH as a threshold voltage, the timing when the sensing voltage Vse passes from below to above the threshold voltage VαL (time t1) occurs earlier than the timing appropriate for the discharge rate changing timing (time t2). The early occurrence of the discharge rate changing timing causes such an inconvenience of impairing the effect of reducing switching loss.

On the other hand, in the example shown in FIGS. 6A and 6B, in using the switching element having the upper limit voltage VthH as a threshold voltage, the specified voltage VαH is adjusted based on experiments. The adjusted specified voltage VαH is made suitable for the discharge rate changing timing (time t2) that exerts a proper effect of reducing switching loss or surge voltage.

When the adjusted specified voltage VαH is applied to the switching element having the lower limit voltage VthL as a threshold voltage, the timing when the sensing voltage Vse passes from below to above the threshold voltage VαH (time t3) occurs later than the timing appropriate for the discharge rate changing timing (time t2). The late occurrence of the discharge rate changing timing causes such an inconvenience as impairing the effect of reducing switching loss.

Although not shown, when the specified voltage VαH is applied to the switching element having the lower limit voltage VthL as a threshold voltage, the sensing voltage Vse does not necessarily reach the specified voltage VαH in switching the switching element to an off state. If the specified voltage VαH is not reached, such a disadvantage is created that the discharge rate is not changed from high to low and thus the effect of reducing surge voltage is not exerted.

In order to avoid the above inconveniences, the specified voltage Vα*# is set to a larger value, as mentioned above, as the threshold voltage Vth*# has a larger value.

Hereinafter is specifically described a process of setting the specified voltage Vα*#. In the present embodiment, the specified voltage Vα*# is set and stored in the memory 14a of the control unit 14 in manufacturing the power control unit.

FIG. 7 is a flow diagram illustrating a process of setting and storing the specified voltage Vα*# in the course of the manufacture.

First, in step S100, the threshold voltage Vth*# is acquired as individual-difference information of the each of the switching elements S*# provided in the power control unit. For example, the threshold voltage Vth*# may be acquired by reading the individual-difference information indicated on each power card. Specifically, for example, the threshold voltage Vth*# may be acquired by reading a QR code (trademark) printed on each power card.

Then, in step S102, the specified voltage Vα*# is set for each of the switching elements S*#. In this case, the specified voltage Vα*# is set to a larger value as the acquired threshold voltage Vth*# has a larger value.

In the subsequent step S104, the specified voltages Vα*# set for the respective switching elements S*# are stored in the memory 14a.

For example, when normal control of the motor-generator 10 is started, each specified voltage Vα*# stored in the memory 14a is transmitted to the drive controller 34 corresponding to the switching element S*# for storage in the memory 34a, via the interface 18 and the terminal T7. Based on the specified voltage Vα*# stored in the memory 34a, the drive controller 34 performs active gate control.

As described above, in the present embodiment, the specified voltage Vα*# is set to a larger value as the threshold voltage Vth*# has a larger value in the course of the manufacture for each of the switching elements S*#. Then, the specified voltages Vα*# are stored in the memory 14a of the control unit 14. Accordingly, for example, the discharge rate changing timing is favorably prevented from being deviated from the appropriate timing, the deviation otherwise occurring due to the individual difference in the threshold voltage of the switching element. Favorably preventing the deviation, the increase of surge voltage or switching loss due to the individual difference is favorably prevented.

In the present embodiment, the specified voltages Vα*# are stored in the memory 14a of the control unit 14 as mentioned above. Usually, manufacture of a power control unit involves a process of storing a program such as of control logic required for controlling the motor-generator 10. In this regard, storage of the specified voltages Vα*# in the memory 14a as described above can reduce the changes in the processes of the manufacture as much as possible, i.e. can reduce the change that would accompany the use of the process of setting the specified voltages Vα*# according to the individual-difference information.

(Second Embodiment)

Figure 8:
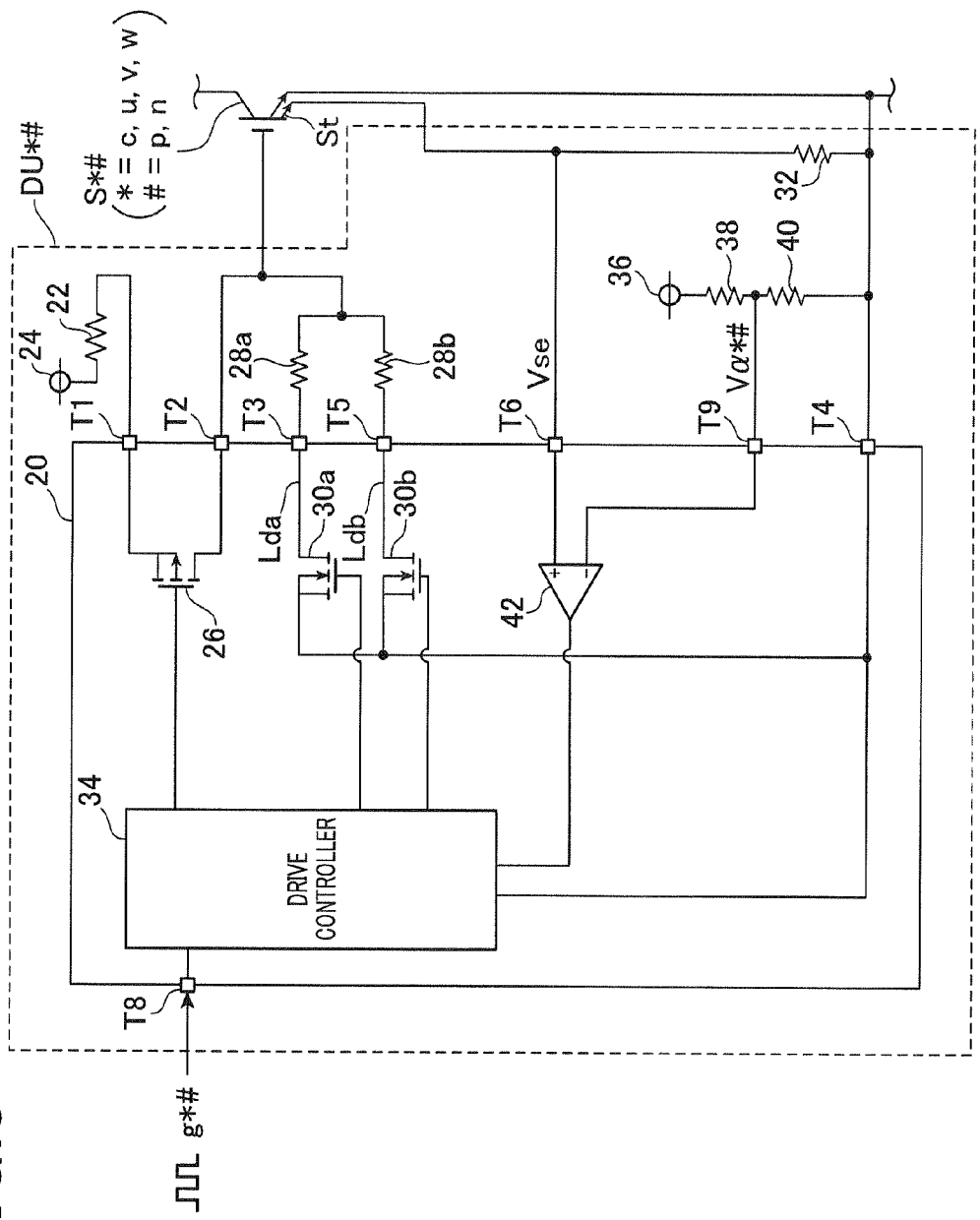
FIG. 8 is a schematic diagram illustrating a drive unit according to a second embodiment.
Figure 9:
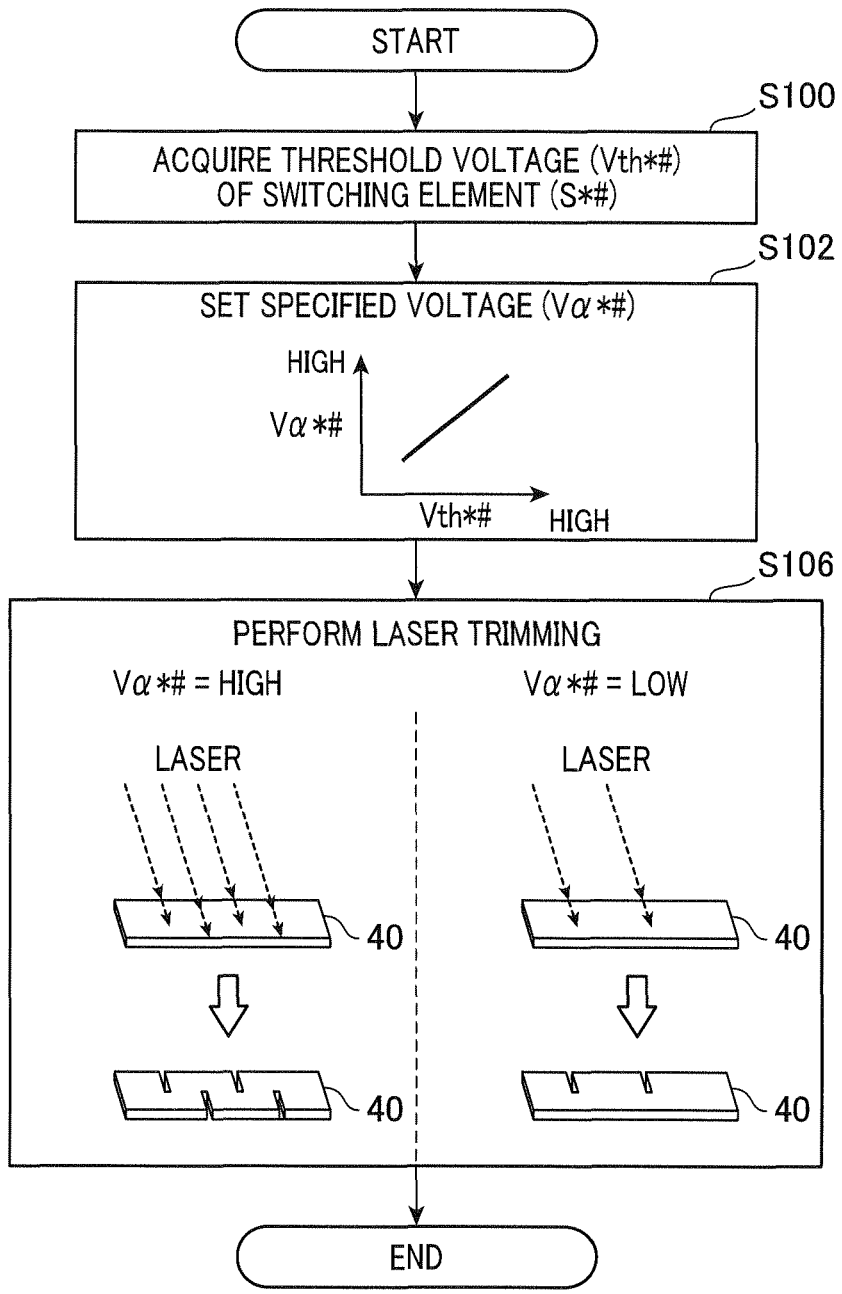
FIG. 9 is a flow diagram illustrating a step of setting a specified voltage in the course of manufacture, according to the second embodiment.

Referring now to FIGS. 8 and 9, hereinafter is described a second embodiment focusing on the differences from the first embodiment. In the second and the subsequent embodiments, the components and steps in flow diagrams, which are identical with or similar to those in the first embodiment, are given the same reference numerals for the sake of omitting unnecessary explanation.

In the second embodiment, the specified voltage Vα*# used for obtaining the discharge rate changing timing is generated by a hardware component.

FIG. 8 is a schematic diagram illustrating a configuration of a drive unit DU*# according to the present embodiment. The drive unit DU*# shown in FIG. 8 does not include the memory 34a and the terminal T7 of FIG. 2 referred to in the first embodiment.

As shown in FIG. 8, the drive unit DU*# includes a constant-voltage power supply 36 which is provided external to the drive IC 20. The constant-voltage power supply 36 is connected to the emitter of the switching element S*# via a serial connection of resistors 38 and 40. The serial connection of the resistors 38 and 40 has a connecting point connected to a terminal T9 of the drive IC 20. In other words, the terminal T9 is applied with a voltage (specified voltage Vα*#) that is obtained by dividing the output voltage of the constant-voltage power supply 36 by using the resistors 38 and 40. In the present embodiment, a trimming resistor is used as the resistor 40. The trimming resistor of the present embodiment is a passive element formed on a circuit board as a thin conductor that can be laser-trimmed.

The drive unit DU*# also includes a comparator 42. The comparator 42 has a non-inverting input terminal connected to the terminal T6, and an inverting input terminal connected to the terminal T9. The output signals of the comparator 42 are inputted to the drive controller 34.

Hereinafter is described a discharge process according to the present embodiment, which is performed by the drive controller 34. In the present embodiment, under the conditions where the operation signal g*# is a turn-off command, the discharge rate is changed from high to low at the timing when the logic of the output signal of the comparator 42 is determined as having been switched from L (low) to H (high).

Hereinafter, a process of setting the specified voltage Vα*# according to the present embodiment is described.

In the present embodiment, the specified voltage Vα*# is set by laser-trimming the resistor 40 at a step of mounting a power card on a circuit board in the course of manufacturing the power control unit.

FIG. 9 is a flow diagram illustrating a series of steps in a process of setting the specified voltage Vα*# in the course of the manufacture.

In the series of steps, after completion of steps S100 and S102, control proceeds to step S106. In step S106, as the specified voltage Vα*# set in step S102 has a larger value, the resistance of the resistor 40 is increased by performing laser trimming. Specifically, for example, as the specified voltage Vα*# set in step S102 has a larger value, the number of cuts formed by laser is increased to increase the resistance. In the present embodiment, the resistor 40 has an initial resistance which is determined so as to enable setting of a specified voltage corresponding to the lower limit voltage VthL among the threshold voltages of mass-produced switching elements.

As described above, the present embodiment includes a circuit configuration in which the specified voltage Vα*# is generated by a hardware component including the constant-voltage power supply 36 and the serial connection of the resistors 38 and 40. With this configuration, the resistor 40 is laser-trimmed to determine the specified voltage Vα*# suitable for the threshold voltage of the switching element. In this case as well, increase of surge voltage or switching loss is favorably suppressed, the increase being due to the individual difference in the threshold voltage of the switching element.

(Third Embodiment)

Figure 10:
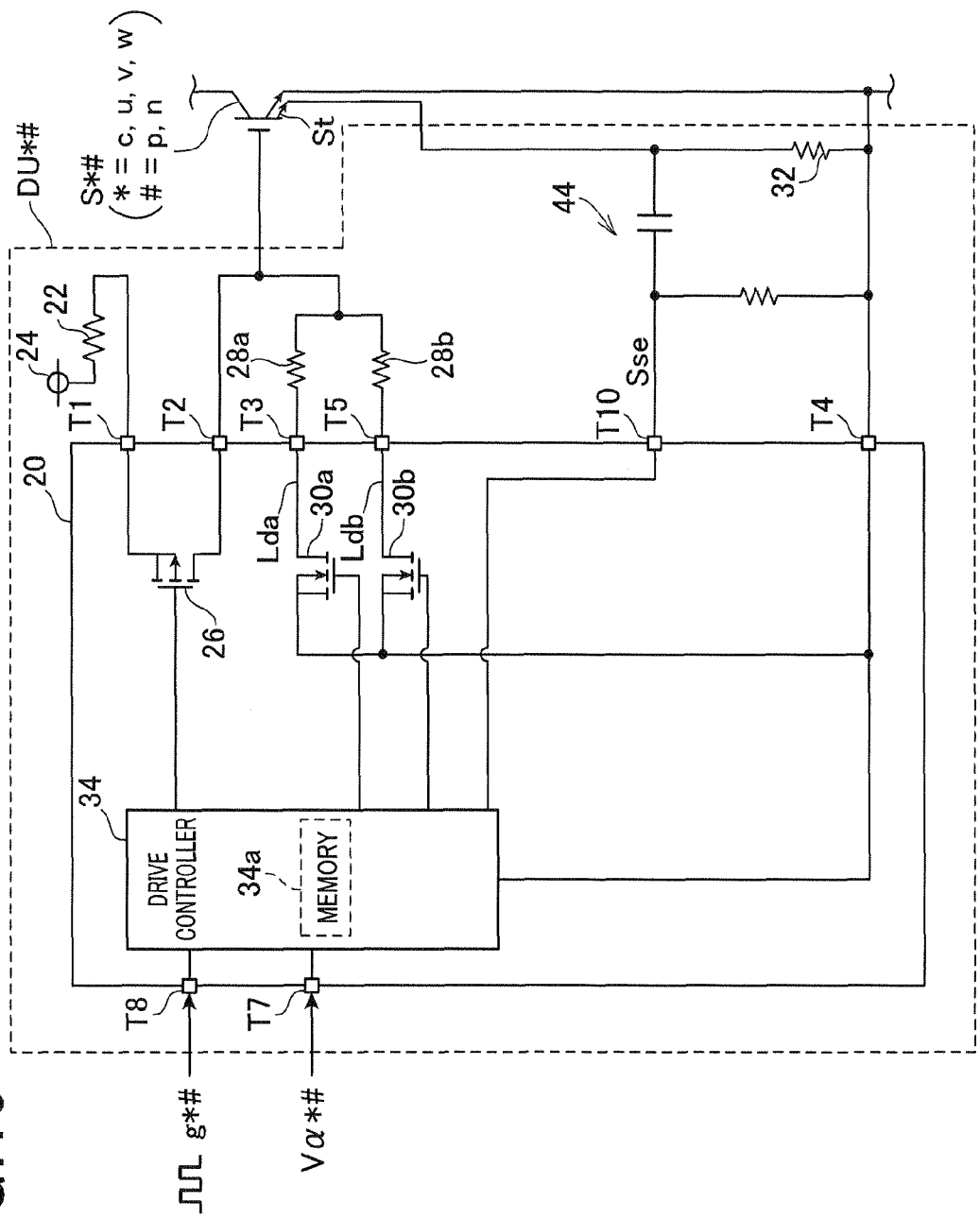
FIG. 10 is a schematic diagram illustrating a drive unit according to a third embodiment.

Referring to FIG. 10, hereinafter is described a third embodiment focusing on the differences from the first embodiment.

In the present embodiment, the discharge rate changing timing is obtained based on an ascent rate of the sensing voltage Vse.

FIG. 10 is a schematic diagram illustrating a drive unit DU*# according to the third embodiment.

As shown in FIG. 10, one of the ends of the sensing resistor 32, which is at a sensing terminal side, is connected to the drive controller 34 via a differentiation circuit 44 and a terminal T10 of the drive IC 20. Thus, the rate of change of the sensing voltage Vse (hereinafter referred to as a voltage change rate Sse) is inputted to the drive controller 34.

Hereinafter, active gate control in a discharge process of the present embodiment is described.

In the present embodiment, the timing of changing the discharge rate from high to low is obtained as the timing for the voltage ascent rate, i.e. the voltage change rate Sse, to pass from below to above a specified rate. Specifically, this timing occurs under the conditions where the sensing voltage Vse increases toward its peak value, as indicated in FIG. 3 as the behavior of the sensing voltage Vse in the vicinity of time t2. The way of obtaining the discharge rate changing timing of the present embodiment is similar to the way of obtaining the discharge rate changing timing on the basis of the sensing voltage Vse. Specifically, the way of obtaining the discharge rate changing timing of the present embodiment is based on the ground that the discharge rate changing timing that can reduce surge voltage or switching loss in turning off the switching element S*# can be correlated to the timing for the voltage ascent rate to pass a specified rate.

Hereinafter, how the specified rate is set is described. In the present embodiment, the specified rate is set for each of the switching elements S*#. In this case, as the threshold voltage Vth*# has a larger value, the specified rate is set to a larger value. The reasons for this are set forth below.

When a threshold voltage is high, the voltage ascent rate tends to become high under the conditions where the inter-collector-emitter voltage Vce increases after the operation signal g*# has been switched to a turn-off command. For example, let us assume that, in using a switching element having the lower limit voltage VthL as a threshold voltage, the specified rate is adjusted so as to be suitable for the appropriate discharge rate changing timing that can reduce surge voltage or switching loss. For example, when the adjusted specified rate is applied to a switching element having the upper limit voltage VthH as a threshold voltage, the timing for the voltage ascent rate to pass from below to above the specified rate occurs earlier than the appropriate discharge rate changing timing, due to the increasing voltage ascent rate. As a result, the effect of reducing switching loss is impaired. In order to avoid this, the specified rate is permitted to have a larger value as the threshold voltage Vth*# has a larger value.

As described above, in spite of the use of the above circuit configuration as well, the discharge rate changing timing may be deviated from the appropriate timing of reducing surge voltage or switching loss, due to the individual difference in the threshold voltage of the mass-produced switching element. Accordingly, the present embodiment uses a process in which the specified rate is set to a larger value as the threshold voltage Vth*# has a larger value. As a result, advantages similar to those obtained in the first embodiment can be obtained.

(Fourth Embodiment)

Figure 11:
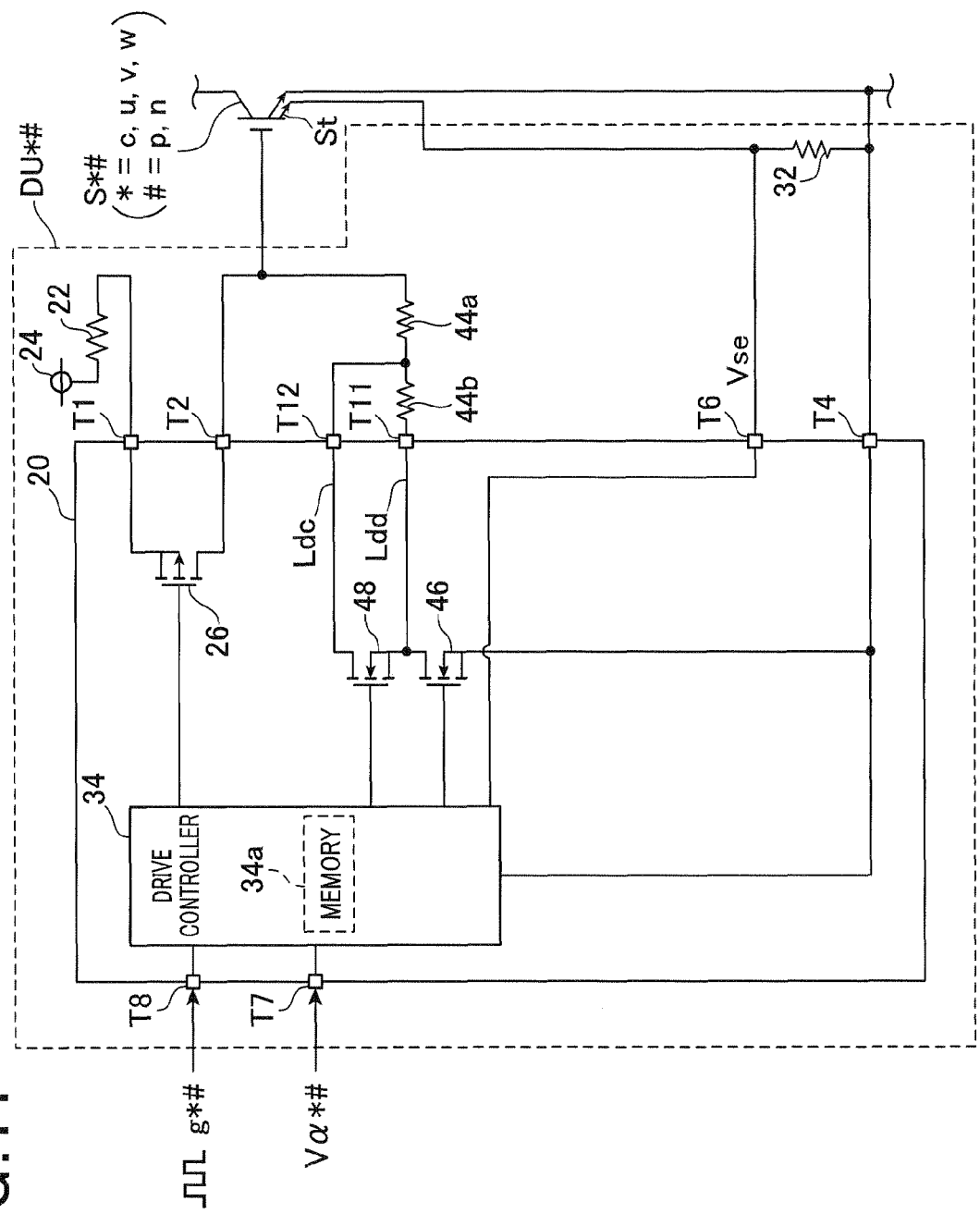
FIG. 11 is a schematic diagram illustrating a drive unit according to a fourth embodiment.

Referring to FIG. 11, hereinafter is described a fourth embodiment focusing on the differences from the first embodiment.

The fourth embodiment is different from the first embodiment in the circuit configuration of the discharging paths for the gate charge.

FIG. 11 is a schematic diagram illustrating a drive unit DU*# of the fourth embodiment.

As shown in FIG. 11, the gate of the switching element S*# is connected to the terminal T4 via a serial connection of discharging resistors 44a and 44b, a terminal T11 of the drive IC 20 and an N-channel MOSFET (third discharging switching element 46). The serial connection of the discharging resistors 44a and 44b has a connecting point which is connected to the terminal T11 via a terminal T12 of the drive IC 20 and an N-channel MOSFET (discharge-side short-circuit element 48).

Hereinafter is described a discharge process conducted of the gate charge according to the present embodiment.

In the present embodiment, when the operation signal g*# is switched to a turn-off command, both of the third discharging element 46 and the discharge-side short-circuit element 48 are turned on to achieve a high discharge rate of the gate charge. Thus, the gate charge is released through a third discharging path Ldc connecting between the gate and the emitter, by way of the discharging resistor 44a, the discharge-side short-circuit element 48 and the third discharging switching element 46. After that, the discharge-side short-circuit element 48 is turned off to change the discharge rate of the gate charge from high to low. Thus, the gate to charge is released through a fourth discharging path Ldd connecting between the gate and the emitter, by way of the serial connection of the discharging resistors 44a and 44b and the third discharging switching element 46. The third and fourth discharging paths Ldc and Ldd correspond to the plurality of discharging paths connected to the gate (charging paths of negative electric charge).

When the above circuit configuration uses the process of setting a larger specified voltage Vα*# as the threshold voltage Vth*# has a larger value, the advantages similar to those obtained in the first embodiment can be obtained.

(Modifications)

The embodiments described above may be modified as set forth below.

The individual-difference information of the switching elements used in setting the specified voltage Vα*# is not limited to the threshold voltage Vth*#. For example, a gate charge capacity Qg may be used as the individual-difference information. In this case, as the gate charge capacity Qg has a smaller value, the sensing voltage Vse tends to have a larger value, under the conditions where the inter-collector-emitter voltage Vice is increasing after the operation signal has been switched to a turn-off command. Therefore, the specified voltage Vα*# may be set to a larger value accordingly.

Further, for example, the individual-difference information may be a peak value of the sensing voltage Vse when the switching element S*# is switched from an on state to an off state, or a maximum value of the voltage ascent rate. In this case, a larger peak value or a larger maximum value of the voltage ascent rate tends to advance the discharge rate changing timing with respect to the appropriate discharge rate changing timing. Therefore, the specified voltage Vα*# may be set to a larger value accordingly. Also, in this case, the peak value or the maximum value is measured in advance for each of mass-produced switching elements and the individual-difference information is indicated in each of the switching to elements (power cards).

Further, for example, the individual-difference information may be a turn-off period toff. In this case, as the turn-off period toff becomes shorter, the sensing voltage Vse tends to have a larger value, under the conditions where the inter-collector-emitter voltage Vice is increasing after the operation signal has been switched to a turn-off command. Therefore, the specified voltage Vα*# may be set to a larger value accordingly.

The specified voltage Vα*# may be set combining some pieces of individual-difference information of each switching element among the pieces of individual-difference information set forth above, if the combination can enhance the accuracy of setting the specified voltage Vα*#.

In the embodiments described above, the active gate control may be performed in a charge process, in addition to or in place of the active gate control in the discharge process. Specifically, in the first embodiment, for example, the circuit configuration may be such that the constant-voltage power supply 24 and the gate of the switching element S*# are connected via a pair of charging paths (charging paths of positive electric charge), with an opening/closing element (e.g., MOSFET) and a resistor being provided to each of the charging paths.

With this configuration, by turning on only one of the opening/closing elements, the charge rate of the gate charge (positive electric charge) is lowered. After that, both of the opening/closing elements are turned on to change the charge rate from low to high. In this case, there is a tendency that, as the time interval is longer from the point of switching the operation signal g*# to a turn-on command until the charge rate changing timing occurs, the effect of reducing surge voltage becomes larger but the effect of reducing switching loss becomes smaller.

After the operation signal g*# is switched to a turn-on command, the phenomenon will occur in which the sensing voltage Vse drastically increases. This phenomenon is considered to be caused by surge voltage which is attributed to recovery current. The recovery current is caused in a freewheel diode connected in inverse parallel with one of the serially connected high- and low-potential side switching elements S*p and S*n, which is not turned on. For example, this phenomenon may be used to obtain the charge rate changing timing. Specifically, for example, the charge rate changing timing may be obtained as the timing when the sensing voltage Vse reaches a specified value (>0) after the operation signal g*# has been switched to a turn-on command. In this case, the specified value may be set to a peak value of the sensing voltage Vse when the switching element is switched to an on state. This setting is based on research conducted by the inventors of the present invention. The research reveals that the timing when the sensing voltage Vse reaches its peak value (e.g., the timing when the mirror period is started under the conditions where the switching element is switched to an on state) can be correlated to the timing of optimizing the effect of reducing switching loss or the like through active gate control.

Using such a process of obtaining the changing timing as well, as the threshold voltage for turning on the switching element has a larger value, the sensing voltage Vse when the switching element is turned on will have a larger value to thereby make its peak value larger. Therefore, the specified value may be set to a higher value accordingly. In this case, "the threshold voltage for turning on the switching element" refers to "the gate voltage Vge at the timing when the collector current Ic starts to flow, under the conditions where charge of the gate charge is continued with the switching of the operation signal to a turn-on command".

In the charge process, the charge rate changing timing may be obtained based on the rate of change of the sensing voltage Vse, in place of the sensing voltage Vse. Specifically, as mentioned above, the timing when the sensing voltage Vse has its peak value may be obtained as the charge rate changing timing. In light of this, the timing when the rate of change of the sensing voltage Vse becomes "0" when the switching element is turned on may be grasped as the charge rate changing timing.

If the rate of change of the sensing voltage Vse is used as a basis, ringing may occur in the sensing voltage Vse under the conditions where the sensing voltage Vse increases toward its peak value after the operation signal g*# has been switched to a turn-on command. Thus, this may impair the accuracy of determining the appropriate charge rate changing timing based on the rate of change of the sensing voltage Vse. For example, in order to avoid this, the rate of change of the sensing voltage Vse in a specific period may be nullified in obtaining the charge rate changing timing. The specific period corresponds to a period during which the operation signal g*# is a turn-on command. Specifically, the specific period corresponds to a period other than the vicinity of a time interval from when the operation signal is switched to a turn-on command until the time point after lapse of a specified time therefrom.

In the active gate control performed in the charge process, the gate charge capacity Qg may be used alternative to the threshold voltage for turning on the switching element. In this case, similar to the discharge process, the specified value or the specified rate may be set to a larger value as the gate charge capacity Qg has a smaller value.

In the first embodiment, the specified voltages Vα*# are stored in the memory 14a of the control unit 14 in the course of manufacturing the power control unit. However, this should not impose a limitation. For example, the specified voltage Vα*# of each switching element S*# may be stored in the memory 34a of the drive controller 34 corresponding to the switching element S*#. In this case, the memory 34a is a non-volatile memory.

In the first embodiment, the specified voltage Vα*# of the individual switching elements S*# are stored in the memory 14a in the course of manufacturing the power control unit. Alternative to the storage in the course of the manufacture, if some site (e.g., car dealer's site) is available for storing the specified voltage Vα*# in the memory 14a after factory shipment, the specified voltage Vα*# may be stored in the memory 14a after the power control unit has been shipped to the site. In this case, for example, the active gate control may be allowed after the control unit 14 determines that the specified voltage Vα# has been stored in the memory 14a. The same applies to the laser trimming of the resistor 40 in the second embodiment described above.

In the second embodiment, one of the resistors 38 and 40 in serial connection, which is at an emitter side with respect to the connecting point therebetween, i.e. the resistor 40, is used as a trimming resistor. However, no limitation should be imposed by this. For example, the resistor 38 which is at a constant-voltage power supply 36 side with respect to the connecting point may be used as a trimming resistor. Alternatively, both of these resistors 38 and 40 may be used as trimming resistors. In this case, if cuts are formed in the resistor 38 as well by laser, the resistance of the resistor 38 is increased to decrease the specified voltage Vα*# accordingly.

The trimming of a resistor is not limited to the one based on the use of laser.

The process of adjusting the resistance of the resistor 40 is not limited to the one exemplified in the second embodiment. For example, the resistor 40 may be one in which the resistance can be variably set under the control of current supply conducted by the drive controller 34.

The circuit configuration shown in FIG. 10 of the third embodiment may include the trimming resistor and the comparator exemplified in the second embodiment. With this circuit configuration, the voltage change rate Sse may be compared with the specified voltage by the comparator to obtain the discharge rate changing timing.

The process of changing the discharge rate is not limited to the one exemplified in the first embodiment. For example, the following process may be used.

The resistance of the first discharging resistor 28a is set to a smaller value than that of the resistance of the second discharging resistor 28b. In this configuration, the first discharging switching element 30a is turned on and the second discharging switching element 30b is turned off to achieve a high discharge rate. Thus, the gate charge is released through the first discharging path Lda. After that, the first discharging switching element 30a is turned off and the second discharging switching element 30b is turned on to achieve a low discharge rate. Thus, the gate charge is released through the second discharging path Ldb.

The process of changing a discharge rate is not limited to the one performed by changing the resistance of a discharging path. For example, a process explained with the following items (A) and (B) may be used.

(A) The discharging path connected to the gate is provided with an opening/closing element (e.g., MOSFET) that can switch the connection between the emitter or a portion having a low potential than the emitter and the gate. In this configuration, only in the initial period of the discharge process, in which a high discharge rate is desired to be achieved, the opening/closing element is operated so that the gate is connected to the portion having a lower potential than the emitter, instead of connecting the gate to the emitter. After that, the operating state of the opening/closing element is changed so as to connect the gate to the emitter. Thus, the discharge rate is changed from high to low.

(B) The discharging path connected to the gate is provided with a first opening/closing element (e.g., MOSFET), which are turned on/off to open/close the path, and a resistor. A power supply is connected to the gate via a predetermined electric path, while the electric path is provided with a second opening/closing circuit (e.g., MOSFET) which is turned on/off to open/close the electric path. In this configuration, upon start of the discharge process, the first opening/closing element is turned on and the second opening/closing element is turned off only in the initial period of the discharge process, in which a high discharge rate is desired to be achieved. After that, the second opening/closing element is turned on. According to such a change of the operating state of the opening/closing elements, current flows from the power supply to the resistor in the discharging path and thus the current that flows from the gate to the resistor decreases. Thus, the gate charge is prevented from being released, and the discharge rate is changed from high to low.

The embodiments described above each include a circuit configuration in which the sensing terminal St is connected to the emitter of the switching element S*# via the sensing resistor 32. However, this should not impose a limitation. For example, the sensing terminal St may be connected to a member having a potential equal to the potential of the emitter (e.g., power supply), instead of being connected to the emitter. In this case, the potential of the power supply is variably set according to the actual potential of the emitter.

The switching element to be driven is not limited to an IGBT but may be a MOSFET.

An object to which the present invention is applied is not limited to a power conversion circuit installed in a vehicle. Also, an object to which the present invention is applied is not limited to a power conversion circuit, such as a converter or an inverter.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As an aspect of the embodiment, a drive unit for a switching element is provided which includes a charging unit which charges an opening/closing control terminal of a voltage-control type switching element (S*#) to switch a drive state of the switching element from an on-state to an off-state, or vice versa. The switching element includes a sensing terminal (St) which outputs a minute current having a correlation with current flowing between an input terminal and an output terminal of the switching element. The sensing terminal and either of the output terminal of the switching element or a member having a potential equal to that of the output terminal are connected via a sensing resistor (32). The drive unit further includes an active gate control unit which changes a charge rate based on comparison of sensing voltage, which is a potential difference across the sensing resistor, or a rate of change of the sensing voltage with a specified value. The specified value is set based on individual-difference information of the switching element which indicates a characteristic, which affects the sensing voltage, when the drive state of the switching element is switched from an on state to an off state, or vice versa.

The inventors of the present invention confirmed a finding regarding the behavior of sensing voltage when the drive state of a switching element is switched between on and off states. The finding is that there is an individual difference in the behavior of the switching element at a level of making impact on the active gate control. In light of this finding, according to the above aspect, a specified value is set on the basis of the individual-difference information of each switching element. Thus, a charge rate can be changed at appropriate timing of reducing surge voltage or switching loss, for each of mass-produced switching elements. Accordingly, surge voltage or switching loss attributed to the individual difference of each switching element is hardly increased in a favorable manner.

The electric charge that switches the drive state of a switching element from an on state to an off state, or vice versa, are not limited to positive electric charge but may be negative electric charge. Accordingly, "providing negative electric charge to the opening/closing control terminal" refers to "releasing positive electric charge from the opening/closing control terminal".

What is claimed is:

1. A drive unit for a switching element, comprising a charging unit which releases charge from an opening/closing control terminal of a voltage-control type switching element to switch a drive state of the switching element from an on-state to an off-state, wherein
   the switching element includes a sensing terminal which outputs a minute current having a correlation with current flowing between an input terminal and an output terminal of the switching element,
   the sensing terminal and either of the output terminal of the switching element or a member having a potential equal to that of the output terminal are connected via a sensing resistor,
   the charging unit includes a path which is connected to the switching element and which releases charge for switching the drive state of the switching element from an on-state to an off-state, and a first resistor and a second resistor which are provided on the path,
   the drive unit further comprises an active gate control unit which changes resistance of the path from low to high to change a discharge rate based on comparison of sensing voltage, which is a potential difference across the sensing resistor, or a rate of change of the sensing voltage with a specified value in a period from when releasing charge is started and until when it is completed;
   the charging unit of the drive unit further includes a charging switching element which switches the drive state of the switching element from an off state to an on state; and a first discharging switching element and a second discharging switching element which are connected to the first resistor and the second resistor, respectively, and switch the drive state of the switching element from an on state to an off state;
   the specified value is set based on individual-difference information of the switching element which indicates a characteristic, which affects the sensing voltage, when the drive state of the switching element is switched from an on state to an off state, the path of the charging unit has a first discharging path and a second discharging path which are connected to the opening/closing control terminal, the first and second discharging switching elements are provided on the first an second discharging paths, respectively, and are turned on and off to open and close the first and second discharging paths, respectively, the first and second resistors are provided on the first and second discharging paths, respectively, and in a period when releasing charge is started and until when it is completed, the active gate control unit changes resistance of the first and second resistors from low to high, in such a manner that the active gate control unit first turns on both of the first discharging switching element and the second discharging switching element to release the charge via both of the first and second resistors, and thereafter, the active gate control unit turns off the second discharging switching element to release the charge via the first resistor.

2. The drive unit according to claim 1, wherein the specified value is set based on voltage applied to the opening/closing control terminal at the timing at which a flow of current between the input terminal and the output terminal is cut off or started when releasing charge from the opening/closing control terminal is continued.

3. The drive unit according to claim 2, wherein the active gate control unit changes the discharge rate from high to low based on the fact that the sensing voltage or a voltage ascent rate of the sensing voltage passes from below to above the specified rate in a period after when releasing charge for switching the drive state of the switching element from an on-state to an off-state is started and until when it is completed, and the specified value is set to a larger value as the voltage applied at the timing at which a flow of current between the input terminal and the output terminal is cut off is larger when releasing charge for switching the drive state of the switching element from an on-state to an off-state is continued.

4. The drive unit according to claim 1, further comprising a storing unit which stores the specified value, wherein the active gate control unit changes the discharge rate by using the specified value stored in the storing unit.

5. The drive unit according to claim 4, wherein the storing unit stores the specified value set based on the individual-difference information of the switching element in the course of manufacturing the drive unit.

6. The drive unit according to claim 1, further comprising:
a power supply, and
a serial connection of resistors which connects the power supply and either the output terminal or a member having a potential equal to that of the output terminal, wherein
the specified value is a voltage obtained by dividing the output voltage of the power supply by using the serial connection.

7. The drive unit according to claim 6, wherein
at least one of the resistors is a trimming resistor whose resistance is adjustable by trimming, and
the specified value is set by adjusting the resistance of the trimming resistor based on the individual-difference information of the switching element.

8. The drive unit according to claim 1, wherein
the active gate control unit changes the discharge rate from high to low by changing an operating state of at least one of the discharging switching elements based on the fact that the sensing voltage or a voltage ascent rate of the sensing voltage passes from below to above the specified rate in a period when releasing charge for switching the drive state of the switching element from an on-state to an off-state is started and until when it is completed.

9. The drive unit according to claim 1, wherein active gate control provided by the active gate control unit reduces surge voltage or switching loss when the switching element is switched from an on state to an off state.

10. The drive unit according to claim 1, wherein the discharge rate is changed from low to high by turning on both discharging switching elements, and after that one of the discharging switching elements is switched to an off state to change the discharge rate from high to low.

11. The drive unit according to claim 1, wherein when a discharge process is performed by the drive unit, the charging switching element is turned off.

* * * * *